United States Patent [19]

Figueroa

[11] 4,446,557
[45] May 1, 1984

[54] MODE-LOCKED SEMICONDUCTOR LASER WITH TUNABLE EXTERNAL CAVITY

[75] Inventor: Luis Figueroa, Raleigh, N.C.

[73] Assignee: Hughes Aircraft Company, El Segundo, Calif.

[21] Appl. No.: 319,014

[22] Filed: Nov. 6, 1981

[51] Int. Cl.³ .............................................. H01S 3/19
[52] U.S. Cl. ...................................... 372/45; 372/18; 372/20; 372/92; 372/19; 372/48; 372/43; 357/17
[58] Field of Search ................................. 372/42–45, 372/49, 92, 18, 20; 350/96.15, 96.20; 357/16, 17; 376/19, 25

[56] References Cited

U.S. PATENT DOCUMENTS

| | | | |
|---|---|---|---|
| 4,132,960 | 1/1979 | Streifer et al. | 372/45 |
| 4,162,460 | 7/1979 | Gonda | 372/43 |
| 4,305,048 | 12/1981 | Copeland | 372/45 |

*Primary Examiner*—William L. Sikes
*Assistant Examiner*—Leon Scott, Jr.
*Attorney, Agent, or Firm*—W. J. Bethurum; A. W. Karambelas

[57] ABSTRACT

A mode-locked gallium arsenide crystal laser has a cavity length equal to one-half its principal noise resonance wavelength and an electrode overlying a portion of the crystal, the remaining portion being a self-aligned region diffused or implanted with impurities comprising saturable absorbing centers. An anti-reflective coating is placed on a crystal facet facing an external mirror defining one end of the laser cavity. The resulting laser has improved power, frequency and temporal stability.

17 Claims, 6 Drawing Figures

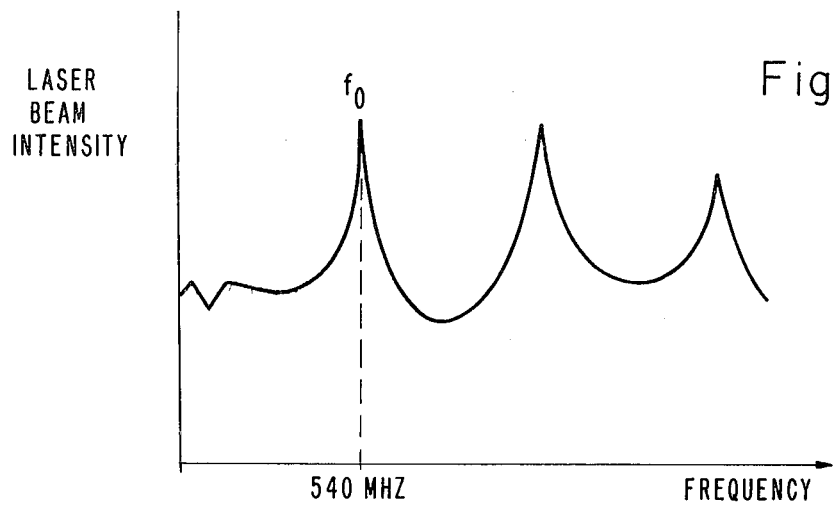
Fig. 3.
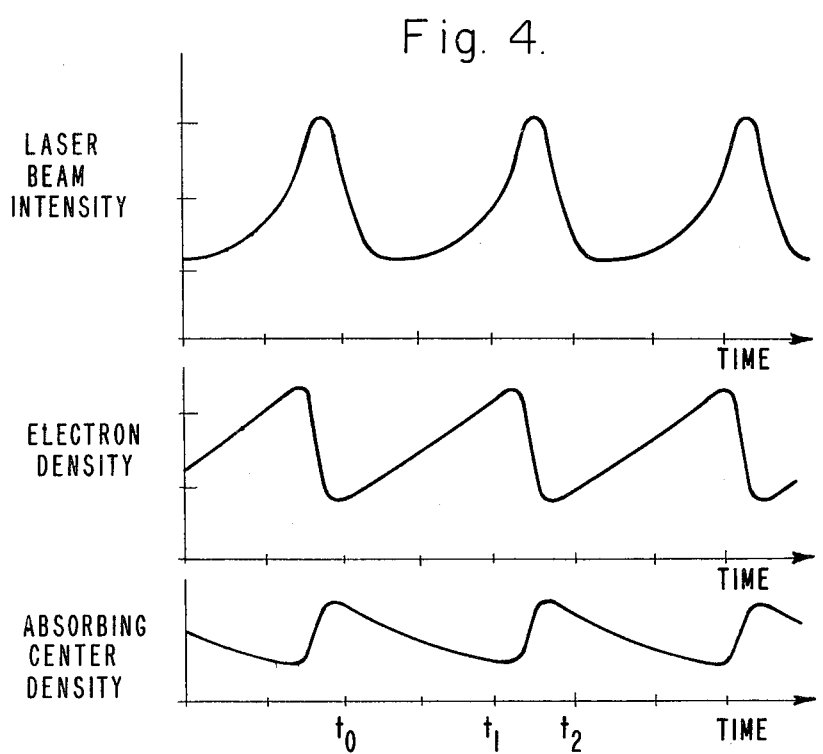
Fig. 4.
Fig. 4a.
Fig. 4b.
Fig. 4c.

MODE-LOCKED SEMICONDUCTOR LASER WITH TUNABLE EXTERNAL CAVITY

GOVERNMENT RIGHTS

This invention was developed under contract funds from the United States Government and the United States Government has rights in this invention.

BACKGROUND OF THE INVENTION

Semiconductor lasers are well-known in the art and are described in the following references, the disclosures of which are incorporated herein by reference:

1. P. T. Ho, L. A. Glasser, E. P. Ippen, and H. A. Haus, "Picosecond Pulse generation with a CW (GaAl)As Laser Diode," *Appl. Phys. Lett.*, V. 33, p. 241–243, Aug. 1978.
2. L. A. Glasser, "C. W. Mode Locking of a GaInAsP Diode Laser," *Elect. Lett.*, V. 14, p. 725–726, November 1978.
3. P. T. Ho, "Coherent Pulse Generation with a GaAlAs Laser by Active Mode Locking," *Elect. Lett.*, V. 15, p. 527–28, August 1979.
4. E. P. Ippen, D. J. Eilenberger, and R. W. Dixon, "Picosecond Pulse Generation by Passive Mode-Locking of Diode Lasers," *Appl. Phys. Lett.*, V. 37, p. 267–270, August (1980).
5. M. B. Holbrook, W. E. Sleat, and D. J. Bradley, "Bandwidth-Limited Picosecond Pulse Generation in an Actively-Mode Locked GaAlAs Diode Laser," *Appl. Phys. Lett.*, V. 37, p. 59–61, July 1980.
6. J. P. Van der Ziel and R. M. Mikulyak, "Modelocking of Strip Buried Heterostructure (AlGa)As Lasers using an External Cavity," *J. Appl. Phys.*, V. 51, p. 3033–3037, June 1980.
7. H. Ito, H. Yokoyama and H. Inaba, "Bandwidth Limited Picosecond Optical Pulse Generation from Actively Mode Locked AlGaAs Diode Laser," *Elect. Lett.*, V. 16, p. 620–621, July 1980.
8. A. Yariv, "Internal Modulation in Multimode Laser Oscillators," *J. Appl. Phys.* V. 36, p. 388, 1965.
9. R. W. Dixon and W. B. Joyce, "A Possible Model for Sustained Oscillations (Pulsations) in (AlGa)As Double-Heterostructure Lasers," *IEEE J. Quart. Elect.*, V. QE–15, pp. 470–474, June 1979.
10. A. E. Diemes, E. P. Ippen and C. V. Shank, *Appl. Phys. Lett.* 19, p. 258 (1971).

Briefly, a typical gallium arsenide (GaAs) semiconductor laser requires three semiconductive layers, including a p-type gallium arsenide layer sandwiched between p-type and n-type gallium-aluminum-arsenide semiconductor layers which, under the influence of an external electric field, inject holes and electrons, respectively, into the sandwiched layer. The external electric field is applied by an electric field-applying electrode disposed on top of the three layers. Each hole and electron pair meeting in the sandwiched layer recombines and creates a photon, the photons so created then resonating in the sandwiched layer so as to produce a laser beam. The sandwiched semiconductor layer thus functions as a laser cavity.

Self-pulsing GaAs semiconductor lasers are useful as high frequency signal generators because their laser output beam is pulsed rather than a continuous wave. The problem in this art has been to reliably reproduce devices having a very high pulse repetition rate with extremely good temporal stability. Currently available devices often suffer from the disadvantage that their pulse rate varies significantly during the life of the device.

A practical problem exists because manufacturers of such devices cannot reliably reproduce a self-pulsing laser of a particular repetition rate. Typically, a manufacturer must operate each device after it is manufactured in order to empirically determine whether it is self-pulsing and, if it is self-pulsing, what its repetition rate is.

SUMMARY OF THE INVENTION

In the present invention, extremely high repetition rates with substantially perfect temporal stability are realized in a mode-locked semiconductor laser having a laser cavity whose length corresponds to half of the principal noise resonance wavelength of the semiconductor cavity. As is well-known in the prior art, a laser is mode locked when all of its resonant longitudinal modes are generated in phase to produce a Fourier sum. This yields a series of pulses having a repetition rate corresponding to $m\,C/2L$, where C is the speed of light in a vacuum, L is the cavity length and m is an integer. Such mode locking is achieved by supplementing the internal laser cavity with an external mirror cavity. A mirror is disposed a particular distance from the crystal so that the combined cavity length is L. The external mirror provides a reflective surface for photon resonance. In this invention, extremely high pulse repetition rates are achieved because the distance of the mirror to the crystal is such that the supplemented cavity length is equal to $C/2mf_0$, where $f_0$ is the self-pulsing noise resonance frequency of the laser crystal cavity. It has been found that this significantly increases the mode locking repetition rate to be on the order of 0.5 to 2 gigahertz. Simultaneously, the power output is increased to be in excess of 20 milliwatts peak. The foregoing represents a significant improvement over the prior art.

Operation of the mode-locked laser of this invention is enhanced by the use of an anti-reflective coating on the surface of the crystal facing the external mirror.

Another feature of the invention is that the repetition rate and pulse width of the laser may be reproducibly preselected in a reliable process. This process consists of the introduction of large numbers of saturable absorbing centers into the path of the laser beam inside the crystal. (The term "saturable absorbing center" is defined in the above-listed references and will be discussed later in this specification.) In a preferred embodiment of the invention, saturable absorbing centers are introduced by implanting or diffusing zinc dopants into the gallium arsenide sandwiched layer where the photon resonance occurs. Preferably, the diffused zinc dopants are placed at either end of the crystal laser cavity comprising the sandwiched gallium arsenide layer. The implanted or diffused zinc atoms serve as saturable absorbing centers. The density of saturable absorbing centers in the path of the laser beam inside the sandwiched gallium arsenide layer determines the repetition rate and the pulse width of the laser beam output in the mode-locked laser operation.

Another feature of the invention is that the optical gain of the laser is increased by decreasing the volume of the optically active region of the semiconductor crystal. This is achieved by reducing the area of the electric-field-applying electrode. In the prior art, such an electrode typically covered the entire top of the crystal. In the present invention, this electrode is withdrawn from the edges of the laser crystal to reduce the laser cavity volume. In the preferred embodiment, this electrode serves as a self-aligning mask for the zinc dopant diffusion or implantation. This feature has the advantage that the diffused or implanted saturable absorbing centers are virtually excluded from the optically active region of the laser which underlies the electrode, and that the region containing the diffused or implanted absorbing centers is automatically aligned with the electrode defining the optically active region. In this manner, the entire inactive region of the laser (the region not covered by the electrode) is filled with absorbing centers.

DESCRIPTION OF THE DRAWINGS

The invention is best understood by reference to the accompanying drawings, of which:

FIG. 2b is a plan view corresponding to FIG. 2a;

FIG. 3 illustrates the noise resonance spectrum of a gallium aluminum arsenide self-pulsing laser;

FIG. 4 illustrates the dynamic behavior of a mode locked pulsing laser, of which:

FIG. 4a illustrates the laser beam intensity as a function of time;

FIG. 4b illustrates the electron carrier density as a function of time;

FIG. 4c illustrates the number of unfilled saturable absorbing centers as a function of time;

DETAILED DESCRIPTION OF THE INVENTION

Figure 1:
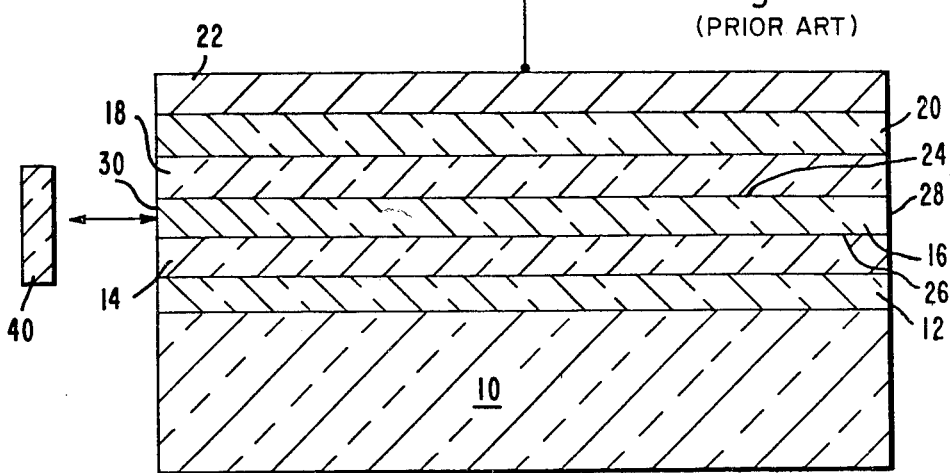
FIG. 1 is a simplified cross-sectional view of a conventional gallium aluminum arsenide laser of the type well known in the prior art.

FIG. 1 is a simplified cross-sectional view of a gallium arsenide semiconductor laser of the prior art comprising a gallium arsenide substrate 10, a buffer layer 12 comprising epitaxial gallium arsenide of n-type conductivity, an electron source layer 14 comprising epitaxial gallium aluminum arsenide of n-type conductivity, a laser optical layer 16 comprising epitaxial gallium arsenide of p-type conductivity, a hole source layer 18 comprising epitaxial gallium aluminum arsenide of p-type conductivity, a top layer 20 comprising epitaxial gallium arsenide and an overlying metal electrode 22. The metal electrode 22 applies an electric field across the foregoing layers so as to forward-bias the pn junction between the layers 14 and 16. This causes electrons from the electron source layer 14 to enter the laser optical layer 16 and holes from the hole source layer 18 to enter the laser optical layer 16. The electrons and holes recombine in the optical layer 16, this recombination creating photons in the optical layer 16. The semiconductor device of FIG. 1 provides a natural optical resonant cavity defined by top and bottom boundaries 24, 26 respectively, of the sandwiched optical layer 16, and crystal facets 28, 30 cut along the sides of the sandwiched laser optical layer 16. The photons thus created inside the laser optical layer 16 resonate coherently within the boundaries described above so as to produce a laser beam in a well-known manner described in the above-referenced publications.

SELF-PULSING

In some cases, the laser of FIG. 1 may be "self-pulsing", meaning that it produces a laser output consisting of a series of laser pulses exiting from one of the facets 28, 30 in a direction parallel to the length of the laser optical layer 16. This self-pulsing action is due most likely to the presence of surface states at the facets 28, 30 acting as saturable absorbing centers. (Surface states in semiconductor crystals are discussed in Grove, *Semiconductor Physics*, Wiley, N.Y., 1966.)

As used in this specification, the term saturable absorbing center refers to an empty crystal state available to accept an electron which has been freed by reason of a collision between that electron and a photon. This collision occurs as follows: a photon produced in the optical layer 16 by the electron-hole recombination process previously described may collide with an electron residing near one of the facets 28, 30. This causes the photon to be absorbed by the electron, enabling it to travel in the crystal, the electron then being absorbed into one of the saturable absorbing centers near the facets 28, 30. Thus, photons are absorbed near the facets 28, 30 (which prevents laser action) until all of the absorbing centers become saturated with electrons, at which time photon absorption ceases. When photon absorption ceases, photon resonance within the optical layer 16 increases until a laser beam is emitted from the optical layer 16. Simultaneously, all of the saturable absorbing centers release their absorbed electrons and the entire process is repeated. This process may be understood by imagining that the saturable absorbing centers at the facets 28, 30 periodically "block" laser beam emission from the optical layer 16 by absorbing the photons created therein for a temporary period of time. The resulting laser beam output resembles a train of pulses having a time domain waveform corresponding to the solid line waveform of FIG. 5. The corresponding noise resonance is illustrated in FIG. 3. Such a self pulsing GaAs laser may be purchased from General Optronics Co., 300 Hadley Rd., South Plainfield, N.J.

MODE-LOCKING

Mode locking arises for photon resonances in the longitudinal direction of the cavity. The repetition rate or frequency of a self-pulsing laser may be increased by mode-locking. Mode-locking is accomplished by providing a mirror 40 external of the laser optical layer 16. Without a mirror, the laser cavity length is the distance between the facets 28, 30. However, in the presence of the mirror 40, the laser cavity length corresponds to the longer distance between the far facet 28 and the mirror 40. The mode locking action in a semiconductor laser arises from the combination of the function of the saturable absorbing centers and a small R.F. signal having a frequency corresponding to C/2L. The saturable absorbing centers reduce the laser beam pulse width in a manner analogous to pulse-width reduction in passively mode-locked dye lasers described in reference 10 cited above. The frequency is determined by the small R.F. signal.

THE INVENTION

Figure 6:
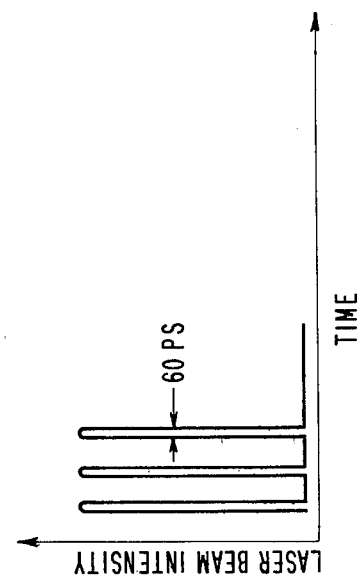
FIG. 6 illustrates the mode-locked laser output beam intensity as a function of time for the laser corresponding to one of the curves of FIG. 5.

In the present invention, a significant increase in the mode-locking repetition rate is achieved by selecting the laser cavity length (defined between the mirror 40 and the far facet 28) to be half of the principal noise resonance wavelength of the laser optical layer 16. In the example of the laser characterized by FIG. 3, the principal noise resonance frequency is 540 megahertz (MHz). Accordingly, in this invention the position of the mirror 40 is such that its displacement from the far facet 28 is equal the speed of light divided by $2 \times (540$ MHz). It has been demonstrated that the mode-locked output of the laser of this invention generates pulses having extremely short width, on the order of 5 picoseconds, a significant improvement over prior art mode locked lasers. FIG. 6 is an exemplary diagram of the time domain waveform of the mode-locked beam intensity produced by the laser of this invention. The peak power output is improved significantly to be in excess of 20 milliwatts.

Figure 2A:
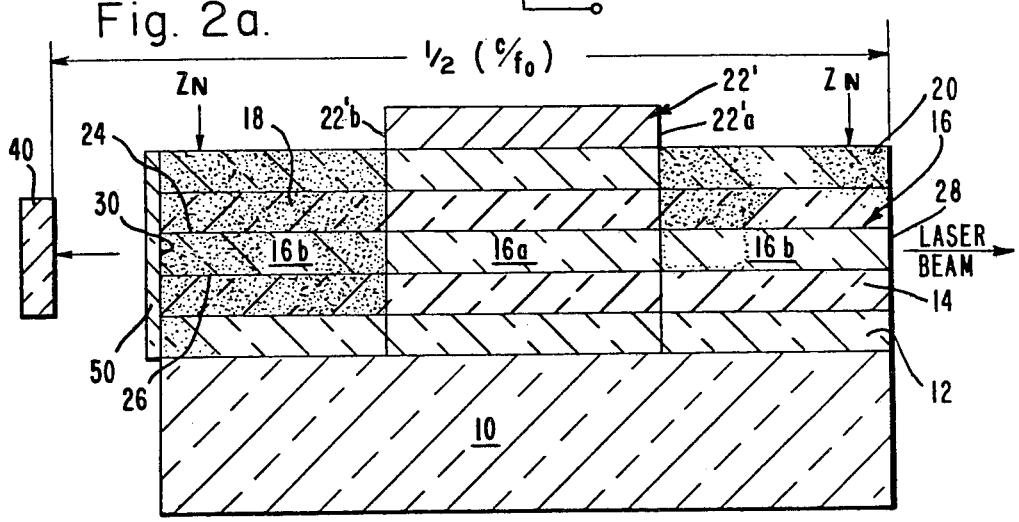
FIG. 2a is a simplified cross-sectional view (which is not to scale) of the gallium aluminum arsenide laser of the present invention.

In the preferred embodiment of the invention, an anti-reflection coating 50 illustrated in FIG. 2a is placed on the exterior of the near facet 30. It has been found that the anti-reflection coating 50 improves the operation of the laser because it reduces the likelihood that photo travel between the mirror 40 and the far facet 28 will be blocked by reflection at the near facet 30.

Figure 2B:
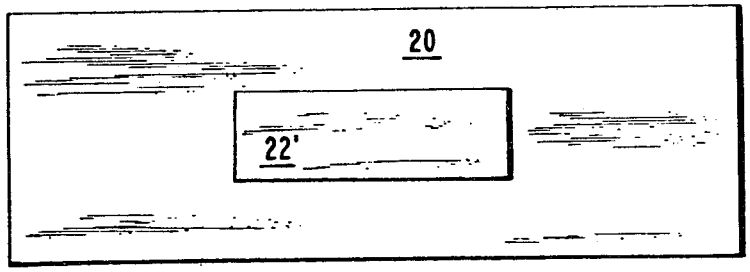

FIGS. 2a and 2b illustrate another feature of the invention, namely the reduction of the volume of the optically active region within the laser optical layer 16. This reduction in volume is achieved by use of a reduced metal electrode 22' which does not cover the entire top surface of the layer 20. Photon creation by electron-hole recombination occurs in the optical layer 16 only in the presence of an electric field. A field is present only in that area of the optical layer 16 which directly underlies the electrode 22'. Accordingly, recombination of holes and electrons occurs in an active region 16a of reduced volume which underlies the shortened electrode 22'. This feature of the invention significantly improves the optical gain of the laser in direct proportion to the reduction in volume of the active region 16a. In this invention, saturable absorbing centers are added by diffusing or implanting zinc atoms through the top layer 20 into that region 16b of the optical layer 16 not underlying the electrode 22'. The electrode 22' functions as a self-aligning mask to the diffusion or implantation of the zinc atoms. The diffused region 16b would, in this example, correspond roughly to the shaded area of FIG. 2a.

This feature of the invention has the advantage that the entire diffusion region 16b is filled with saturable absorbing centers. Furthermore, little or no absorbing centers are diffused into the optically active region 16a underlying the electrode 22' wherein the electron-hole recombination is substantially confined, a significant advantage.

Figure 5:
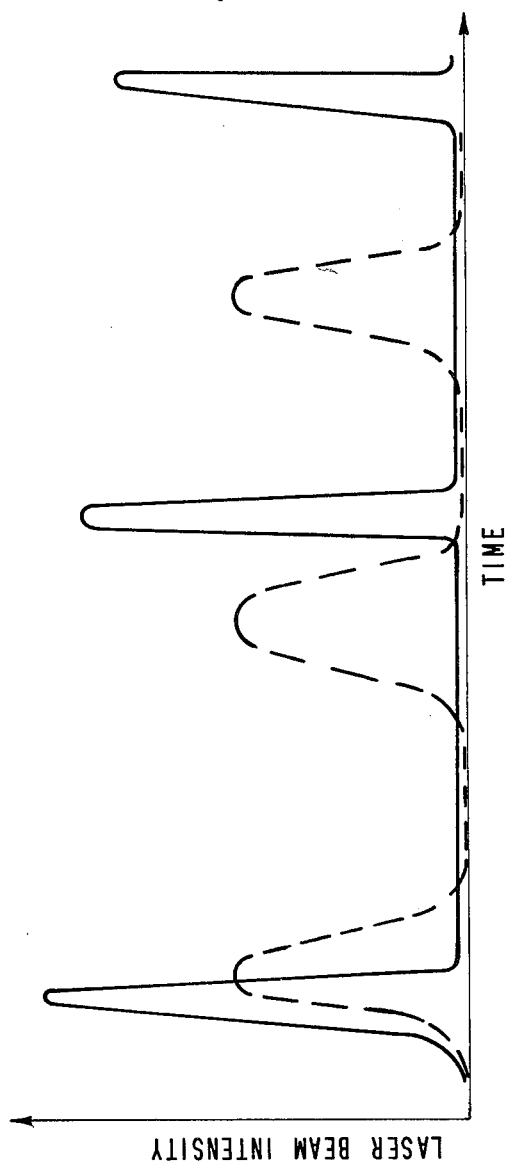
FIG. 5 illustrates two different curves depicting the self-pulsing laser beam intensity as a function of time, each of the curves corresponding to a different saturable absorbing center density in the laser.

Another feature of the invention is that the concentration of the zinc impurities in the diffused region 16b determines the laser repetition rate and pulse width in both self-pulsing and mode-locking operation. For example, FIG. 5 illustrates the self-pulsing laser output beam intensity as a function of time for a low density zinc diffusion (solid line) and for a high density zinc diffusion (dashed line). The zinc diffusion may be adjusted by a skilled worker to achieve the pulse width or repetition rate desired for either self-pulsing or mode locking operation.

The saturable absorbing centers provided by the zinc atoms in the diffused region 16b (which may be called "dopant saturable absorbing centers") vastly out-number the saturable absorbing centers provided by the surface states at the facets 28 and 30. Therefore, the repetition rate and pulse width of the device of FIG. 2 is not subject to the usual variations in surface state density plaguing the prior art devices of the type illustrated in FIG. 1 during their lifetime. Surface state density can change dramatically with contamination and other factors which vary during the life of the device. Accordingly, this invention significantly improves the temporal stability of the laser.

Mode-locking operation of the laser of FIGS. 2a and 2b is best understood by reference to FIGS. 4a, b and c. Initially, at time $t_0$, the number of saturable absorbing centers is at a maximum, as illustrated in FIG. 4c. As the electrons and holes from the source layers 14 and 18, respectively, recombine in the active region 16a, photons are produced which are absorbed by the electrons in the saturable absorbing centers in the diffused region 16b. Accordingly, the number of saturable absorbing centers begins to decrease at time $t_0$, as illustrated in FIG. 4c. As a result, both the photon density and the electron density in the laser optical layer 16 begin to increase at time $t_0$. When the number of saturable absorbing centers has decreased to a minimum at time $t_1$, the photon density and electron density have increased to a maximum (as illustrated respectively in FIGS. 4a and 4b), causing a pulsed laser beam to be emitted from the far facet 28. Simultaneously, both the photon density and the electron density begin to decrease after time $t_1$ while the number of saturable absorbing centers begins to increase until, at time $t_2$, the number of absorbing centers has increased to a maximum while the photon and electron densities have decreased to their approximate minimum. The process is repeated cyclically so as to generate the train of laser output pulses illustrated in FIG. 6.

The preferred construction of the invention illustrated in FIGS. 2a and 2b will now be described. The substrate is gallium arsenide of n-type conductivity doped to have an impurity concentration of $10^{18}$ atoms per cubic centimeter. The thickness of the substrate 10 is on the order of 100 to 125 micrometers. The buffer layer 12 is a liquid phase epitaxial gallium arsenide layer doped to have an n-type conductivity with an impurity concentration of $10^{18}$ atoms per cubic centimeter and has a thickness on the order of 5 micrometers. The electron source layer 14 is liquid phase epitaxial gallium aluminum arsenide layer of n-type conductivity doped to have an impurity concentration on the order of $10^{17}$ atoms per cubic centimeter and has a thickness on the order of 1 to 2 micrometers. Aluminum atoms in the gallium aluminum arsenide layer 14 comprise on the order of 35% of the atoms in the layer 14. The optical layer 16 is a liquid phase epitaxial gallium arsenide layer doped to have p-type conductivity with an impurity concentration of $10^{17}$ atoms per cubic centimeter and a thickness on the order of 0.2 to 0.3 micrometers. Some aluminum is present in the optical layer 16 on the order of 7% of all atoms in the layer. The hole source layer comprises a liquid phase gallium aluminum arsenide layer doped to have a p-type conductivity with an impurity concentration of $5 \times 10^{17}$ atoms per cubic centimeter and has a thickness on the order of 1 to 2 micrometers. Aluminum in the gallium aluminum arsenide substrate 18 comprises on the order of 35 percent of all atoms in the layer 18. The top layer 20 comprises a liquid phase epitaxial gallium arsenide layer having a very small concentration of impurities therein and a thickness of 1 to 2 micrometers. The metal 22' is deposited over the layer 20 and may be, for example, indium or gold or aluminum. The laser reflecting mirror 40 may be of any well-known optical substance useful in laser cavities.

The anti-reflection coating 50 comprises $Al_2O_3$ which is sputtered onto the near facet 30.

The concentration of aluminum atoms in each of the layers 14, 16 and 18 sets the energy bandgap between the valence and conduction bands in the source layers 14, 18 to be on the order of 1.7 electron volts. In the laser optical layer 16 the bandgap is less, being on the order of 1.5 electron volts. Because of this band gap difference, holes and electron injected into the optical layer 16 are virtually confined in the latter despite the fact that both layers are of p-type conductivity.

The thickness of the laser optical layer 16 is selected to be between 0.3 and 0.4 micrometers as described above in order to minimize the volume of the laser active region 16a for the reasons previously described. Thus, the volume is minimized in the present invention by restricting the length of the metal electrode 22' and by restricting the thickness of the optical layer 16. The extent of the metal electrode 22' is illustrated in plan view of FIG. 2b. Typically, the metal electrode 22' is on the order of 10 micrometers in width and 150-300 micrometers in length, leaving a portion of the laser cavity 16 of 1 to 5 micrometers in length uncovered.

In summary, the invention realizes a significant improvement for gallium arsenide lasers in temporal stability, pulse repetition rate and power while permitting the pulse repetition rate of the laser to be reproducibly selected during fabrication.

What is claimed is:

1. A semiconductor crystal laser having a very high pulse repetition rate, comprising:
    a semiconductor hole source layer and a semiconductor electron source layer overlying said substrate;
    a semiconductor optical layer sandwiched between said hole source and electron source layers, said optical layer having a principal noise resonance frequency $f_0$, said optical layer being defined by a near facet and a far facet facing one another;
    electrode means for applying an electric field across said optical layer; and
    an external mirror facing said near facet and defining a laser cavity between said mirror and said far facet, said mirror being located such that the length L of said laser cavity is equal to $C/2mf_0$, where C is approximately the speed of light and m is an integer; an electrode of said electrode means partially overlying said electron source, hole source and optical layers so as to cover a partial region of said optical layer; and dopant substrate absorbing centers deposited in a remaining region of said optical layer, said remaining region of said optical layer being registered with said electrode.

2. The laser of claim 1 wherein said deposited dopant saturable absorbing centers comprise diffused semiconductor dopant impurities in said semiconductor optical layer.

3. The laser of claim 1 wherein said dopant saturable absorbing centers comprise zinc impurities in said semiconductor optical layer, and wherein said semiconductor optical layer comprises a gallium-aluminum-arsenide crystal.

4. The laser of claims 1 wherein said electron source layer comprises a liquid phase epitaxial n-type gallium-aluminum-arsenide layer overlying a substrate, said optical layer comprises a liquid phase epitaxial p-type gallium arsenide layer overlying said electron source layer, and said hole source layer comprises a liquid phase epitaxial p-type gallium-aluminum-arsenide layer overlying said optical layer.

5. A gallium arsenide laser capable of mode-locking at a very high repetition rate with improved temporal stability, comprising:
    a gallium arsenide substrate;
    a p-type conductivity gallium arsenide hole source layer and an n-type conductivity gallium arsenide electron source layer overlying said substrate;
    a gallium arsenide optical layer sandwiched between said hole source and electron source layers, said optical layer comprising a self-pulsing laser cavity having a principal noise resonance frequency $f_0$, said optical layer being bounded by a near facet and a far facet;
    an electrode partially overlying said hole source, electron source and optical layers so as to cover a partial region of said optical layer;
    zinc dopant impurities residing in a remaining portion of said optical layer, said remaining region of said optical layer being in at least approximate registration with said electrode; and
    an external mirror facing said near facet and defining a mode locking laser cavity between said mirror and said far facet, said mirror being located such that the length L of said mode locking laser cavity is equal to $C/2mf_0$, where C is approximately the speed of light and m is an integer.

6. The laser of claims 1, or 5 further comprising an anti-reflective coating deposited on said near facet.

7. The laser of claims 1, or 5 further comprising an anti-reflective coating on the near facet which functions to reduce the amount of light reflected at said near facet.

8. The laser of claims 1 or 5 wherein m is at least 2.

9. A method for making a self-aligned semiconductor crystal laser including a semiconductor optical layer having a top boundary, comprising:
    forming an electrode over said top boundary overlying only a first portion of said optical layer;
    depositing saturable absorbing centers through said top boundary into the remaining portion of said optical region in the presence of said electrode.

10. The method of claim 12 wherein said depositing step comprises diffusing dopant impurities into said optical layer.

11. The method of claim 9 wherein said depositing step comprises implanting said dopant impurities into said optical layer.

12. The method of claim 9 wherein said optical layer is bounded on two ends by a pair of crystal facets and wherein said method further comprises depositing an anti-reflective coating onto one of said facets.

13. The method of claim 12 wherein said anti-reflection coating depositing step comprises sputtering aluminum oxide onto said one facet.

14. The method of claim 12 further comprising placing a mirror near said one facet and facing said facet.

15. The method of claim 9 wherein said semiconductor optical layer comprises gallium arsenide and wherein said depositing step comprises placing zinc impurities into said optical layer.

16. The method of claim 9 wherein said semiconductor optical layer is bounded on two ends by a pair of crystal facets, said method further comprising:

placing an anti-reflective coating on one of said facets; and placing a mirror near said one facet and facing said facet.

17. The method of claim 16 wherein said optical layer has a principal noise resonance frequency $f_0$ and wherein said placing step comprises locating said mirror at a distance from the other of said facets equal to $C/2mf_0$, where C is approximately the speed of light and m is an integer.

* * * * *